United States Patent [19]
Eastty et al.

[11] Patent Number: 6,144,328
[45] Date of Patent: Nov. 7, 2000

[54] CASCADED DELTA SIGMA MODULATORS

[75] Inventors: Peter Charles Eastty, Eynsham; Peter Damien Thorpe, Botley; Christopher Sleight, Chipping Norton, all of United Kingdom

[73] Assignee: Sony United Kingdom Limited, Weybridge, United Kingdom

[21] Appl. No.: 09/177,394

[22] Filed: Oct. 23, 1998

[30] Foreign Application Priority Data

Oct. 24, 1997 [GB] United Kingdom .................. 9722522

[51] Int. Cl.$^7$ ....................................... H03M 3/00
[52] U.S. Cl. ............................................... 341/143
[58] Field of Search ................... 341/143, 76, 77

[56] References Cited

U.S. PATENT DOCUMENTS

| | | | |
|---|---|---|---|
| 5,311,181 | 5/1994 | Ferguson, Jr. et al. ............... | 341/143 |
| 5,581,253 | 12/1996 | Brown ..................................... | 341/143 |
| 6,057,792 | 5/2000 | Eastty et al. ............................ | 341/143 |
| 6,061,007 | 5/2000 | Eastty et al. ............................ | 341/143 |

FOREIGN PATENT DOCUMENTS 0 650 261  4/1995  European Pat. Off. .

*Primary Examiner*—Trong Phan
*Attorney, Agent, or Firm*—Frommer. Lawrence & Haug, LLP.; William S. Frommer

[57] ABSTRACT

A signal processor for processing 1-bit signals comprising at least a pair of Delta Sigma Modulators (DSM) coupled in series, one of the said pair of DSMs having an signal-band noise-shaping filter characteristic complementary to the signal-band noise-shaping filter characteristic of the other of the pair of DSMs.

12 Claims, 4 Drawing Sheets

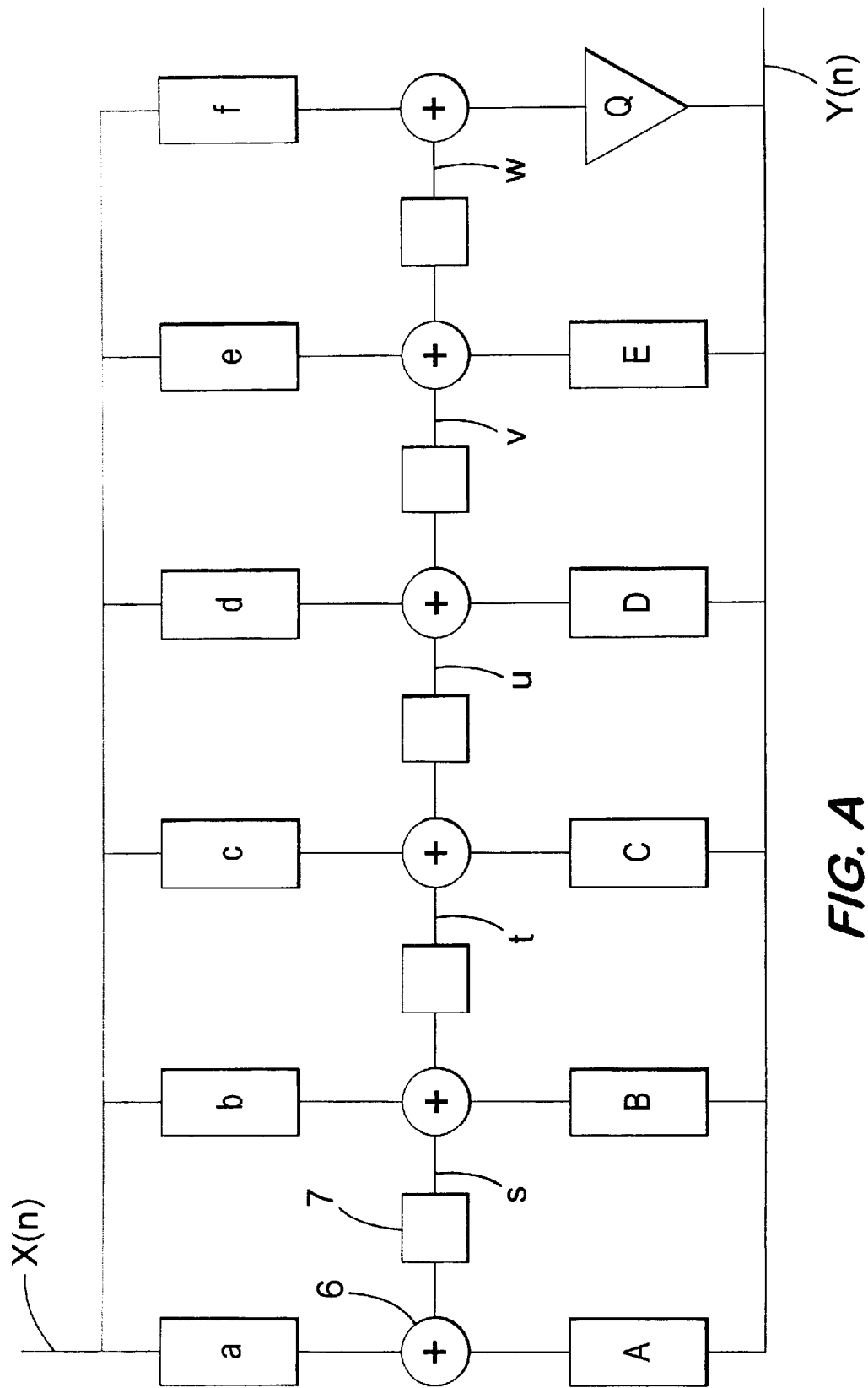
*FIG. A*

CASCADED DELTA SIGMA MODULATORS

BACKGROUND OF THE INVENTION

1. Field of the Invention

The present invention relates to 1-bit audio signal processors and, in particular, cascaded Delta Sigma Modulators.

2. Description of the Prior Art

Background to the present invention will now be described by way of example with reference to FIGS. 1, 2 and 3 of the accompanying drawings of which FIG. 1 is a block diagram of a known Delta-Sigma Modulator, FIG. 2 is a block diagram of a previously proposed Delta-Sigma Modulator configured as an 3rd order (n=3) filter section and FIG. 3 shows a noise shaping characteristic.

It is known to convert an analogue signal to a digital form by sampling the analogue signal at least the Nyquist rate and encoding the amplitudes of the samples by an m bit number. Thus if m=8, the sample is said to be quantized to an accuracy of 8 bits. In general m can be any number of bits equal to or greater than 1.

For the purpose of quantizing to only 1 bit, it is known to provide an analogue to digital converter (ADC) known either as a "Sigma-Delta ADC" or as a "Delta-Sigma ADC". Herein the term "Delta-Sigma" is used. Such an ADC is described in for example "A Simple Approach to Digital Signal Processing" by Craig Marven and Gillian Ewers ISBN 0-904.047-00-8 published 1993 by Texas Instruments.

Referring to FIG. 1 in an example of such an ADC, the difference 1 (Delta) between an analogue input signal and the integral 2 (Sigma) of the 1-bit output signal is fed to a 1-bit quantizer 3. The output signal comprises bits of logical value 0 and 1 but representing actual values of −1 and +1 respectively. The integrator 3 accumulates the 1-bit outputs so that value stored in it tends to follow the value of the analog signal. The quantizer 3 increases (+1) or reduces (−1) the accumulated value by 1-bit as each bit is produced. The ADC requires a very high sampling rate to allow the production of an output bit stream the accumulated value of which follows the analogue signal.

The term "1-bit" signal as used in the following description and in the claims means a signal quantized to an accuracy of 1 digital bit such as is produced by a Delta-Sigma ADC.

A Delta-Sigma Modulator (DSM) configured as nth order filter section for directly processing a 1-bit signal was proposed by N. M. Casey and James A. S. Angus in a paper presented at the 95th AES Convention Oct. 7–10, 1993 New York, USA entitled "One Bit Digital Processing of Audio Signals"—Signal Processing: Audio Research Group, The Electronics Department, The University of York, Heslington, York YO1 5DD England. FIG. 2 shows a 3rd order (n=3) version of such a DSM filter section.

Referring to FIG. 2, the DSM has an input 4 for a 1-bit audio signal and an output 5 at which a processed a 1-bit signal is produced. The bits of the 1-bit signal are clocked through the DSM by known clocking arrangements which are not shown. The output 1-bit signal is produced by a 1-bit quantizer Q which is for example a comparator having a threshold level of zero. The DSM has three stages each comprising a first 1-bit multiplier $a_1, a_2, a_3$ connected to the input 4, a second 1-bit multiplier $c_1, c_2, c_3$ connected to the output 5, an adder $6_1, 6_2, 6_3$ and an integrator $7_1, 7_2, 7_3$.

The 1-bit multipliers multiply the received 1-bit signal by p bit coefficients $A_1, A_2, A_3, C_1, C_2, C_3$ producing p bit products which are added by the adders $6_1, 6_2, 6_3$ and the sums passed to the integrators 7. In the intermediate stages the adders $6_2, 6_3$ also sum the output of the integrator of the preceding stage. A final stage comprises another 1-bit multiplier $A_4$ connected to the input which multiplies the input signal by a p bit coefficient $A_4$ and an adder $6_4$ which adds the product to the output of the integrator $7_3$ of the preceding stage. The sum is passed to the quantizer 2.

Within the DSM, two's complement arithmetic maybe used to represent the positive and negative p bit numbers. The input to the quantizer Q may be positive, quantized at the output as +1 (logical 1) or negative quantized at the output as −1 (logical 0).

As observed by Casey and Angus "a one bit processor . . . will produce a one bit output that contains an audio signal that is obscured by noise to an unacceptable level and it is imperative the quantization noise is suitably shaped". The noise which obscures the audio signal is the quantization noise produced by the quantizer Q.

The quantizer Q may be modelled as an adder which has a first input receiving an audio signal and a second input receiving a random bit stream (the quantization noise) substantially uncorrelated with the audio signal. Modelled on that basis, the audio signal received at the input 4 is fed forward by multipliers $a_1, a_2, a_3, a_4$ to the output 5 and fed back by multipliers $c_1, c_2, c_3$ from the output 5. Thus coefficients A1 to A4 in the feed forward path define zeros of the Z-transform transfer function of the audio signal and coefficients C1–C3 in the feed back path define poles of the transfer function of the audio signal.

The noise signal, however is fed-back from the quantizer by the multipliers C1–C3 so that coefficients C1–C3 define poles of the transfer function of the noise signal. The transfer function of the noise signal is not the same as that of the input signal.

The coefficients A1 to A4 and C1 to C3 are chosen to provide circuit stability amongst other desired properties.

The coefficients C1–C3 are chosen to provide noise shaping so as to minimise quantization noise in the audio band, as shown for example in FIG. 3 by the full line 31.

The coefficients A1–A4 and C1–C3 are also chosen for a desired audio signal processing characteristic.

The coefficients A1–A4 and C1–C3 may be chosen by:

a) finding the Z-transform H(z) of the desired filter characteristic—e.g noise shaping function; and b) transforming H(z) to coefficients.

This may be done by the methods described in the papers "Theory and Practical Implementation of a Fifth Order Sigma-Delta A/D Converter, Journal of Audio Engineering Society, Volume 39, no. 7/8, 1991 July/August by R. W Adams et al." and in the paper by Angus and Casey mentioned hereinbefore and using the knowledge of those skilled in the art. One way of calculating the coefficients is outlined in the accompanying Annex A.

It is proposed herein that a signal processor may comprise a plurality of DSMs coupled in series or cascaded, to process 1-bit signals. Such a proposal is not known from the papers mentioned above. A proposed audio signal processor for processing 1-bit signals comprises a plurality of DSMs arranged in series. Such an arrangement has the disadvantage that noise, especially quantisation noise, accumulates as a signal is processed by successive DSMs.

Thus, it is desirable to provide signal filtering between DSMs and also to maintain a 1-bit signal stream between DSMs. Such filtering may be needed for example to prevent undesired build-up of quantisation noise in successive DSMs. However, prior proposals of suitable digital filters would at least sum bits of the stream resulting in multi-bit numbers and/or multiply the bit stream by one or more p bit coefficients. All the coefficient multipliers of a DSM downstream of such a filter would then receive a p bit signal and would need to be p bit multipliers which are uneconomic.

SUMMARY OF THE INVENTION

According to the present invention, there is provided a signal processor for processing 1-bit signals comprising at least a pair of Delta Sigma Modulators (DSM) coupled in series, one of the said pair of DSMs having a signal-band noise-shaping filter characteristic complementary to the signal-band noise-shaping filter characteristic of the other of the pair of DSMs.

Preferably the signal processor is an audio signal processor. By providing successive DSMs with complementary filter characteristics at least in the audio band the accumulation of noise in the band is at least reduced. Furthermore, not all multipliers of each DSM are p-bit multipliers. Each DSM in the series produces a 1-bit signal which is supplied to the next DSM in the series.

In a preferred embodiment of the invention, the coefficients of the DSM are chosen to be integer powers of two or additive combinations of integer powers of two so that multiplication can be performed by simple shift operations or simple shift and add operations avoiding p-bit multipliers.

In a most preferred embodiment of the invention the DSMs have a Chebyschev filter characteristic, in particular a Chebyschev II type characteristic.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
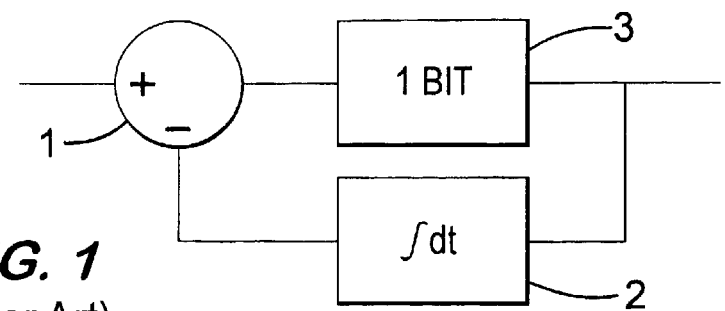
Figure 2:
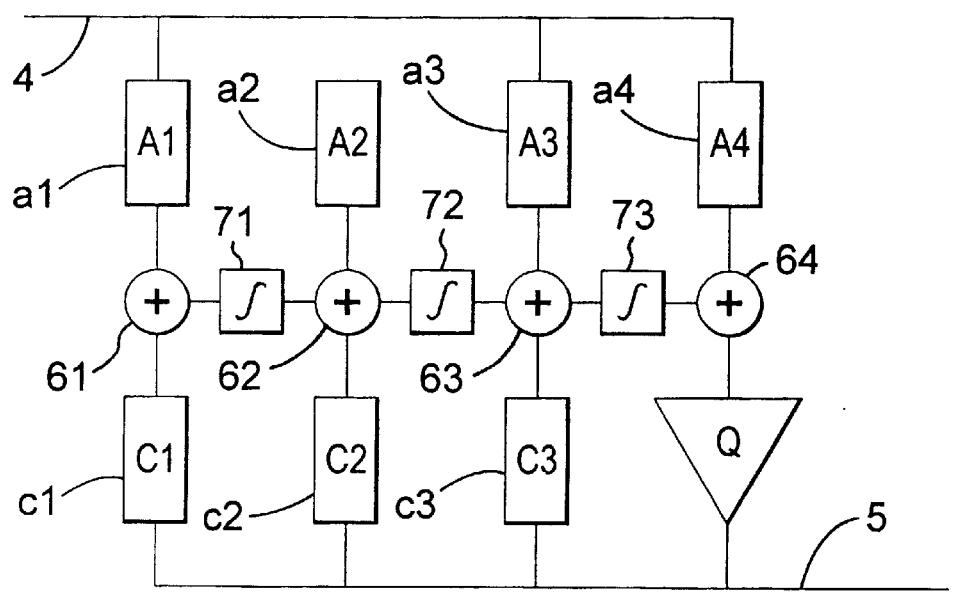
Figure 3:
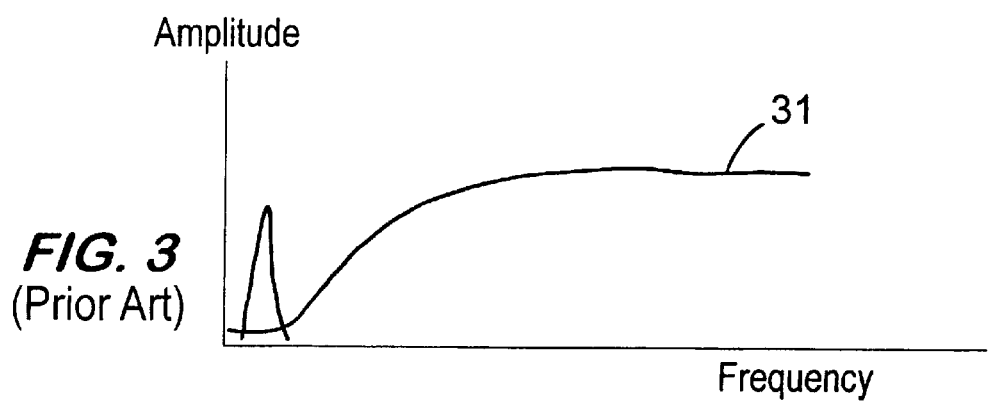
Figure 4:
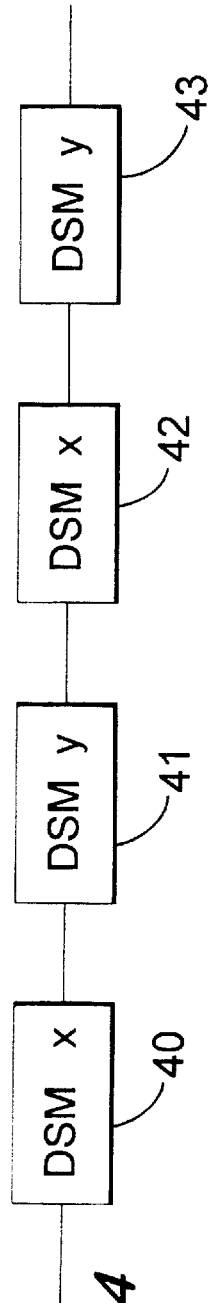
FIG. 4 is a block diagram of an audio signal processor comprising successive DSMs.
Figure 5:
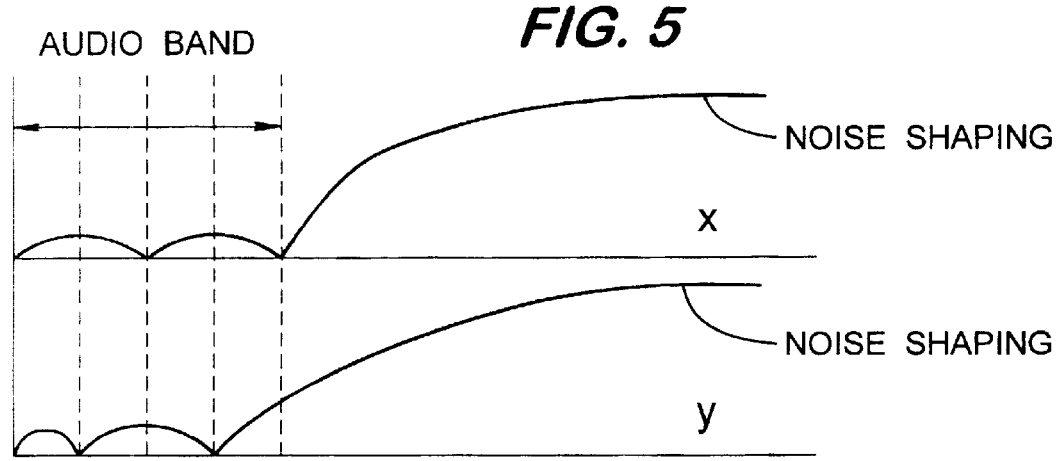
FIG. 5 comprises amplitude-frequency diagrams of filter characteristics of DSMs of FIG. 4.

Referring to FIG. 4 an illustrative audio signal processor according to the invention comprises a series of 1-bit Delta sigma Modulators (DSM) 40,41, 42 and 43. Although the only four DSMs are shown there may be other numbers of DSMs. Furthermore although FIG. 4 shows one series arrangement, the DSMs may be arranged in other configurations in accordance with the invention provided there are at least two DSMs in series in such other configurations. As shown in FIG. 4 there are two types of DSMs denoted as types X and Y. Referring to FIG. 5, types X and Y have complementary noise-shaping filter characteristics in the audio signal band. As shown, type X has a filter characteristic in the audio band with notches in the response which coincide with the peaks of the response of the type Y filter characteristic (and vice-versa). By providing types X and Y in series noise, especially quantization noise in cascaded DSMs is reduced improving filter stability and signal to noise ratio. Each DSM 40,41,42 and 43 receives a 1-bit signal and outputs a 1-bit signal. Thus, the need for p-bit multipliers is minimised, and as described herein below may be avoided.

Figure 6:
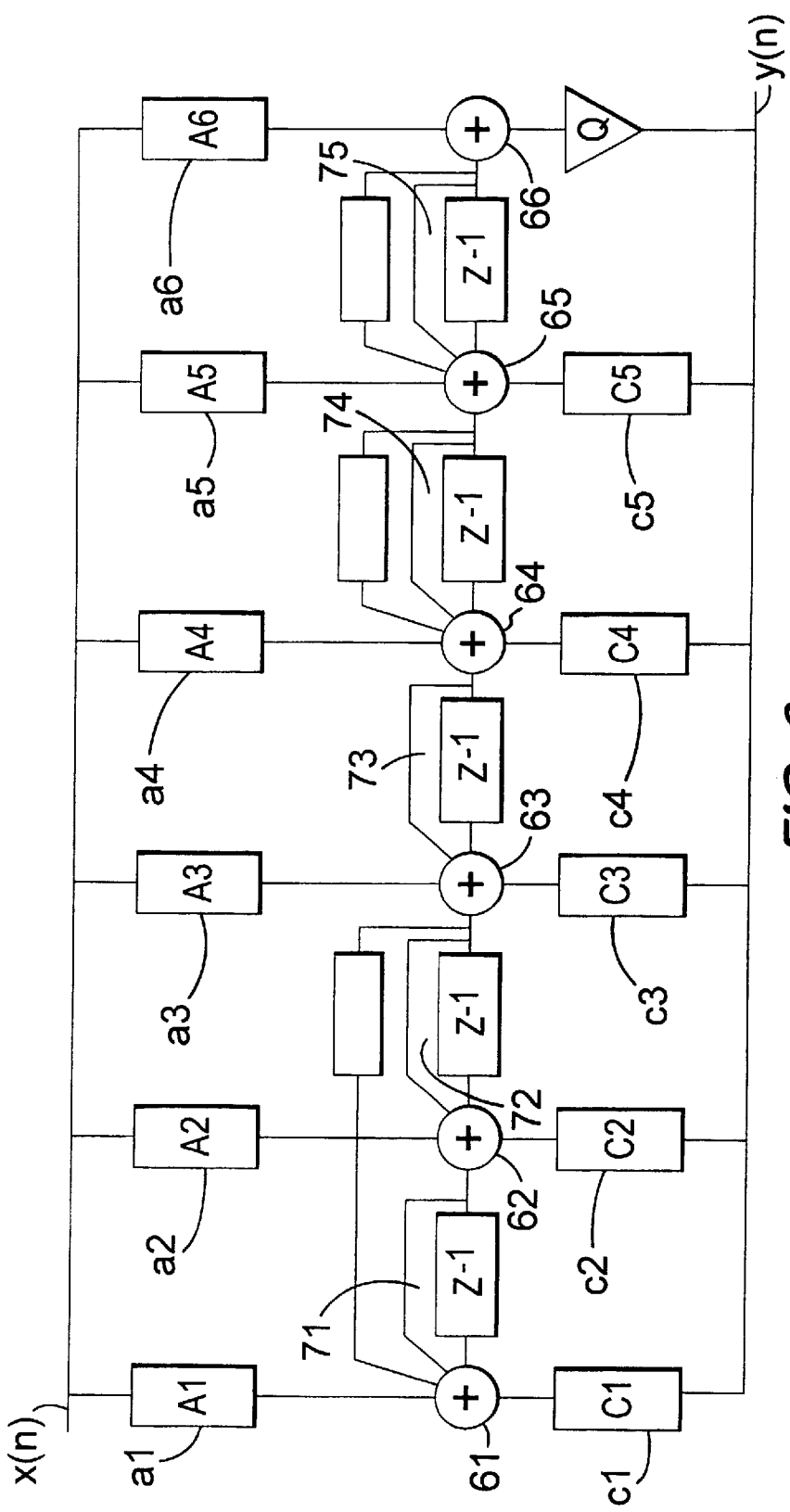
FIG. 6 is a block diagram of a DSM suitable for producing a filter characteristic shown in FIG. 5.

FIG. 6 shows an illustrative DSM useful as an above mentioned type X or Y DSM. The DSM implements a Chebyschev type II filter characteristic.

The DSM is a clocked circuit which clocks 1-bit signal samples through the circuit at the signal sampling rate which may be e.g. about 28 MHz for a 1-bit audio signal. Such clocking arrangements are known in the art and will not be described herein.

The DSM is an nth order filter having n integration stages and a final stage. In this example n is five but in general n is at least two.

A first integration stage comprises: a first 1-bit multiplier a1 which multiplies the 1-bit input signal x(n) by a first coefficient A1; a second one bit multiplier c1 which multiplies a 1-bit output signal Y(n) of the DSM by a second coefficient C1; an adder 61 which adds the outputs of the coefficient multipliers a1 and c1; and an integrator 71 which has a delay of one bit period of the 1-bit signal.

Figure 7:
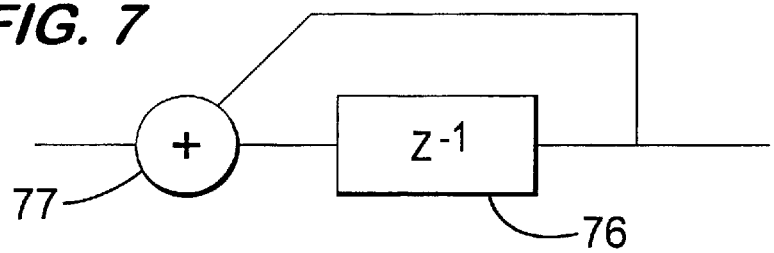
FIG. 7 is a block diagram of a DSM useful as a signal mixer and having a filter characteristic as shown in FIG. 5.

An example of an integrator is shown in FIG. 7. It comprises a 1 bit delay 76 connected to the output of an adder 77 with a feedback path from the output of the delay to the adder. The adder 77 of the integrator may be implemented by the adder 61 of the stage or separate therefrom.

There are n-1 intermediate stages of which the second stage comprises: a first coefficient multiplier a2; a second coefficient multiplier c2; an adder 62; and an integrator 72 which are arranged and function in the same way as the corresponding items of the first stage except that the adder 62 of the second stage is also connected to receive the output of the integrator 71 of the preceding stage.

In addition a feedback multiplier alpha is connected from the output of the second stage to the adder of the first stage. The feedback multiplier multiplies the output of the integrator of the second stage by a coefficient alpha.

The third stage a3, c3, 63, 73 is similar to the first stage except that its adder also receives the output of the integrator 72 of the preceding stage. The fourth stage is similar to the second stage. A feedback multiplier beta feedsback the output of the integrator 74 of the fourth stage to the adder 63 of the third stage. The fifth stage comprises a first coefficient multiplier a5; a second coefficient multiplier c5; an adder 65; an integrator 75 and a feedback multiplier gamma which feedsback the output of the fifth stage integrator to the fifth stage adder.

The final stage comprises a first coefficient multiplier a6; an adder 66 which adds the output of the integrator of the preceding fifth stage to the output of the first multiplier a6 of the final stage; and a quantizer Q which converts the p-bit signal produced by the final stage adder 66 to 1-bit form as the output signal Y(n) of the DSM.

The said first and second coefficient multipliers an and cn are 1-bit multipliers which produce values −A, +A−C and +C according to the value of the bit of the 1-bit signal. For fixed values of A and C they may be look-up tables addressed by the 1-bit signal. They produce multi-bit signals. The feedback multipliers alpha, beta and gamma are multi-bit because they necessarily multiply multi-bit signals by multi-bit coefficients. In a preferred embodiment of the DSM the coefficients alpha, beta and gamma are integer powers of two or additive combinations of integer powers of two so that the multiplications can be performed by simple shift and add operations avoiding multibit multipliers.

The coefficients A1 to A6, C1 to C5, alpha, beta and gamma are chosen by methods within the skill of those in the art to implement a Chebyschev type II filter characteristic. The first coefficients A1 to A6 are variable in one embodiment of the invention to vary the gain of the DSM.

Figure 8:
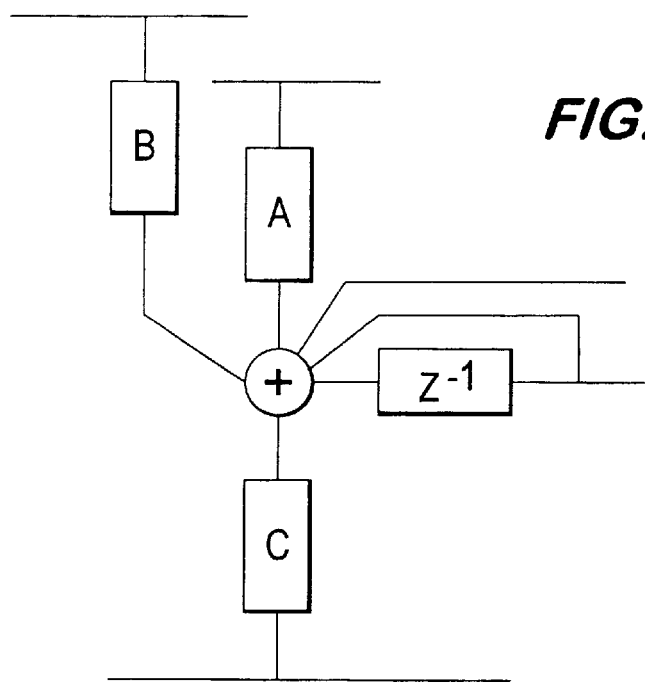
FIG. 8 is a block diagram of one of the stages of a signal mixer.

In another embodiment of the invention, the DSM is arranged as a signal mixer: such an embodiment is shown in FIG. 8 which illustrates just one of the stages of the DSM. As shown in FIG. 8, each stage additionally comprises a third 1-bit coefficient multiplier B connected to a second input and connected too the adder of the stage. The third coefficients B may be variable so that the DSM operates as a variable signal mixer.

The variable coefficients are generated by a coefficient generator (not shown) which comprise a microcomputer.

It will be appreciated that the analysis of Appendix A needs modifying to take account of the feedback coefficients alpha, beta and gamma. Such modification is within the skill of the person in the art.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

CALCULATING COEFFICIENTS

This annex outlines a procedure for analysing a fifth order DSM and for calculating coefficients of a desired filter characteristic.

A fifth order DSM is shown in Figure A having coefficients a to f and A to E, adders 6 and integrators 7. Integrators 7 each provide a unit delay. The outputs of the integrators are denoted from left to right s to w. The input to the DSif is a signal x[n]0 where [n] denotes a sample in a clocked sequence of samples. The input to the quantizer Q is denoted y[n] which is also the output signal of the DSM. The analysis is based on a model of operation which assumes quantizer Q is simply an adder which adds random noise to the processed signal. The quantizer is therefore ignored in this analysis.

The signal y[n]=fx[n]+w[n] i.e. output signal y[n] at sample [n] is the input signal x[n] multiplied by coefficient f plus the output w[n] of the preceding integrator 7.

Applying the same principles to each output signal of the integrators 7 results in Equations set 1.

$y[n]=fx[n]+w[n]$ $w[n]=w[n-1]+ex[n-1]+Ey[n-1]+v[n-1]$ $v[n]=v[n-1]+dx[n-1]+Dy[n-1]+u[n-1]$ $u[n]=u[n-1]+cx[n-1]+Cy[n-1]+t[n-1]$ $t[n]=t[n-1]+bx[n-1]+By[n-1]+s[n-1]$ $s[n]=s[n-1]+ax[n-1]+Ay[n-1]$

These equations are transformed into z-transform equations as well known in the art resulting in equations set 2.

$Y(z)=fX(z)+W(z)$ $W(z)(1-z^{-1})=z^{-1}(eX(z)+EY(z)+V(z))$ $V(z)(1-z^{-1})=z^{-1}(dX(z)+DY(z)+U(z))$ $U(z)(1-z^{-1})=z^{-1}(cX(z)+CY(z)+T(z))$ $T(z)(1-z^{-1})=z^{-1}(bX(z)+BY(z)+S(z))$ $S(z)(1-z^{-1})=z^{-1}(aX(z)+AY(z))$

The z transform equations can be solved to derive Y(z) as a single function of X(z) (Equation 3)

$$Y(z) = fX(z) + \frac{z^{-1}}{(1-z^{1})}\Big(eX(z) + EY(z) + \frac{z^{-1}}{1-z^{-1}}\big(dX(z) + DY(z) + \frac{z^{-1}}{1-z^{-1}}\big(cX(z) + CY(z) + \frac{z^{-1}}{1-z^{-1}}\big(bX(z) + BY(z) + \frac{z^{-1}}{1-z^{-1}}\big(aX(z) + AY(z)\big)\big)\big)\big)\Big)$$

This may be reexpressed as shown in the right hand side of the following equation, Equation 4. A desired transfer function of the DSM can be expressed in series form $$\frac{Y(z)}{X(z)}$$

given in left hand side of the following equation and equated with the right hand side in Equation 4.

$$\frac{Y(z)}{X(z)} = \frac{\alpha_0 + \alpha_1 z^{-1} + \alpha_2 z^{-2} + \alpha_3 z^{-3} + \alpha_4 z^{-4} + \alpha_5 z^{-5}}{\beta_0 + \beta_1 z^{-1} + \beta_2 z^{-2} + \beta_3 z^{-3} + \beta_4 z^{-4} + \beta_5 z^{-5}}$$

$$= \frac{f(1-z^{-1})^5 + z^{-1}e(1-z^{-1})^4 + z^{-2}d(1-z^{-1})^3 + z^{-3}c(1-z^{-1})^2 + z^{-4}b(1-z^{-1}) + z^{-5}a}{(1-z^{-1})^5 + z^{-1}E(1-z^{-1})^4 + z^{-2}D(1-x^{-1})^3 + z^{-3}C(1-z^{-1})^2 + z^{-4}B(1-z^{-1}) + Z^{-5}A}$$

Equation 4 can be solved to derive the coefficients f to a from the coefficients $\alpha_0$ to $\alpha_5$ and coefficients E to A from the coefficients $\beta_0$ to $\beta_5$ as follows noting that the coefficients $\alpha_n$ and $\beta_n$ are chosen in known manner to provide a desired transfer function.

f is the only $z^0$ term in the numerator. Therefore $f=\alpha^0$.

The term $\alpha_0(1-z^{-1})^5$ is then subtracted from the left hand numerator resulting in $\alpha_0+\alpha_1 z^{-1}\ldots+\ldots\alpha_5 z^{-5}-\alpha_0(1-z^{-1})^5$ which is recalculated.

Similarly $f(1-z^{-1})^5$ is subtracted from the right hand numerator. Then e is the only $z^{-1}$ term and can be equated with the corresponding $\alpha_1$ in the recalculated left hand numerator.

The process is repeated for all the terms in the numerator.

The process is repeated for all the terms in the denominator.

We claim:

1. A signal processor for processing 1-bit signals comprising at least a pair of Delta Sigma Modulators (DSM) coupled in series, one of the said pair of DSMs having a signal-band noise-shaping filter characteristic complementary to the signal-band noise-shaping filter characteristic of the other of the pair of DSMs.

2. A processor according to claim 1, comprising a plurality of DSMs connected in series, each DSM having a signal-band noise shaping characteristic complementary to that of its adjacent DSM in the series.

3. A processor according to claim 1, wherein each of the said DSMs receives a 1-bit signal and outputs a 1-bit signal.

4. A processor according to claim 3, wherein each DSM is an nth order DSM where n is at least two and comprises:

an input for receiving a 1-bit signal;

a quantizer for requantising a p-bit signal to 1-bit form the requantised signal being the output signal of the DSM; and a plurality of signal combiners including
a first combiner for forming an integral of an additive combination of the product of the input signal and a first coefficient and of the product of the output signal and a second coefficient (n-1) intermediate combiners each for forming an integral of an additive combination of the input signal and a first coefficient and of the product of the output signal and a second coefficient and of the integral of the preceding combiner, a final combiner for forming an additive combination of the product of the input signal and a first coefficient and the integral of the preceding stage to produce the said p-bit signal; and at least one feedback multiplier which forms the product of the output of a predetermined one of the combiners with a feedback coefficient and couples the said product to an input of a predetermined one of the combiners.

5. A processor according to claim 4 wherein the said combiners are organised in pairs, the or each pair comprising a said feedback multiplier which forms the product of the integral of a succeeding one of the combiners of the pair and feeds the product back to an input of the preceding combiner of the pair.

6. A processor according to claim 5, wherein, if n is an odd number greater than 2, one of the combiners has a feedback multiplier which feedsback the product of the integral of that combiner with a feedback coefficient to an input of that same combiner.

7. A processor according to claim 4, wherein the said first coefficients are variable to control the gain of the DSMs.

8. A processor according to claim 4, wherein the or each feedback coefficient is an integer power of two or an additive combination of integer powers of two.

9. A processor according to claim 4, wherein each DSM has a Chebyshev type II filter characteristic.

10. A processor according to claim 4, wherein, in at least one of the DSMs, the said additive combination formed by each combiner further includes the product of a further input signal and a third coefficient whereby the said one of the DSMs is a signal combiner.

11. A processor according to claim 10, wherein the third coefficients are variable.

12. An audio signal processor according to claim 1.

* * * * *